(12) United States Patent
Chiu

(10) Patent No.: US 10,199,501 B2
(45) Date of Patent: Feb. 5, 2019

(54) METHOD FOR FORMING SEMICONDUCTOR STRUCTURE

(71) Applicant: UNITED MICROELECTRONICS CORP., Hsin-Chu (TW)

(72) Inventor: Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/678,100

(22) Filed: Aug. 15, 2017

(65) Prior Publication Data

US 2017/0345937 A1 Nov. 30, 2017

Related U.S. Application Data

(62) Division of application No. 14/954,967, filed on Nov. 30, 2015, now Pat. No. 9,773,910.

(30) Foreign Application Priority Data

Nov. 4, 2015 (TW) .............................. 104136243 A

(51) Int. Cl.
| | |
|---|---|
| *H01L 21/321* | (2006.01) |
| *H01L 29/66* | (2006.01) |
| *H01L 29/165* | (2006.01) |
| *H01L 29/78* | (2006.01) |
| *H01L 21/02* | (2006.01) |
| *H01L 29/06* | (2006.01) |
| *H01L 29/10* | (2006.01) |

(52) U.S. Cl.
CPC .... *H01L 29/7851* (2013.01); *H01L 21/02532* (2013.01); *H01L 21/32105* (2013.01); *H01L 29/0649* (2013.01); *H01L 29/1054* (2013.01); *H01L 29/165* (2013.01); *H01L 29/66431* (2013.01); *H01L 29/66795* (2013.01)

(58) Field of Classification Search
CPC ................................................... H01L 29/0826
USPC .......................................................... 257/190
See application file for complete search history.

(56) References Cited

U.S. PATENT DOCUMENTS

| 7,799,592 B2 | 9/2010 | Lochtefeld |
| 9,245,951 B1* | 1/2016 | Camillo-Castillo ........................ H01L 29/0826 |
| 2007/0254440 A1* | 11/2007 | Daval ............... H01L 21/02126 438/285 |
| 2009/0008705 A1 | 1/2009 | Zhu |

(Continued)

*Primary Examiner* — Moazzam Hossain
*Assistant Examiner* — Omar F Mojaddedi
(74) *Attorney, Agent, or Firm* — Winston Hsu

(57) ABSTRACT

A method for manufacturing a semiconductor structure includes the following steps. First, a semiconductor substrate including a first semiconductor material is provided. The semiconductor substrate includes a dielectric structure formed thereon, and the dielectric structure includes at least a recess formed therein. A first epitaxial layer is then formed in the recess. The first epitaxial layer includes at least a second semiconductor material that a lattice constant of the second semiconductor material is larger than a lattice constant of the first semiconductor material. Subsequently, a thermal oxidation process is performed to the first epitaxial layer thereby forming a semiconductor layer at a bottom of the recess and a silicon oxide layer on the semiconductor layer. After removing the silicon oxide layer, a second epitaxial layer is formed on the semiconductor layer in the recess.

14 Claims, 8 Drawing Sheets

(56) References Cited

U.S. PATENT DOCUMENTS

| | | | |
|---|---|---|---|
| 2014/0138742 A1* | 5/2014 | Wann | H01L 29/66795 257/190 |
| 2015/0091099 A1* | 4/2015 | Ching | H01L 27/0886 257/401 |
| 2015/0287614 A1* | 10/2015 | Cheng | H01L 21/82380 257/192 |
| 2016/0104770 A1 | 4/2016 | Camillo-Castillo | |
| 2016/0268394 A1 | 9/2016 | Hur | |

\* cited by examiner

METHOD FOR FORMING SEMICONDUCTOR STRUCTURE

CROSS REFERENCE TO RELATED APPLICATIONS

This application is a division of U.S. application Ser. No. 14/954,967 filed Nov. 30, 2015, and incorporated herein by reference in its entirety.

BACKGROUND OF THE INVENTION

1. Field of the Invention

The present invention relates to a semiconductor structure and a manufacturing method thereof, and more particularly, to a semiconductor fin structure and a manufacturing method thereof.

2. Description of the Prior Art

Epitaxial structures are prevalently used in a wide variety of semiconductor applications. For example, the prior art usually forms an epitaxial layer such as an epitaxial silicon germanium (hereinafter abbreviated as SiGe) layer in a single crystal substrate by performing a selective epitaxial growth (hereinafter abbreviated as SEG) method. Because the lattice constant of the epitaxial SiGe layer is larger than that of the silicon substrate, a strain stress is generated to the metal-oxide semiconductor (hereinafter abbreviated as MOS) transistor device. Accordingly, carrier mobility in the channel region is improved and the speed of the MOS transistor device is increased.

Although the epitaxial structures efficiently improve device performance, it increases complexity of the semiconductor fabrication and difficulties of process control. For example, though higher Ge concentration in the epitaxial SiGe layer improves device performances, dislocation defects usually occur in the higher Ge concentration and/or thicker epitaxial SiGe layer due to the lattice mismatch between the materials. The dislocation defect unwantedly reduces the strain stress. Therefore, it is getting more and more difficult to design and fabricate semiconductor devices having epitaxial structures.

Accordingly, though the epitaxial structure is able to improve the device performance, it is always in need to provide semiconductor devices as expected when the progress of semiconductor manufacturing technology is improved and complexity of the products is increased.

SUMMARY OF THE INVENTION

According to an aspect of the present invention, a semiconductor structure is provided. The semiconductor structure includes a semiconductor substrate, at least a semiconductor layer formed on the semiconductor substrate, and at least a fin formed on the semiconductor layer. The semiconductor substrate includes a first semiconductor material, the semiconductor layer includes the first semiconductor material and a second semiconductor material, and the fin includes at least the first semiconductor material. A lattice constant of the second semiconductor material is different from a lattice constant of the first semiconductor material. The semiconductor layer further includes a first width, the fin further includes a second width, and the second width of the fin is smaller than the first width of the semiconductor layer.

According to an aspect of the present invention, a method for manufacturing a semiconductor structure is provided. The method includes following steps: A semiconductor substrate including a first semiconductor material is provided. The semiconductor further includes a dielectric structure formed thereon, and the dielectric structure includes at least a recess formed therein. Next, a first epitaxial layer is formed in the recess. The first epitaxial layer includes at least a second semiconductor material, and a lattice constant of the second semiconductor material is larger than a lattice constant of the first semiconductor material. After forming the first epitaxial layer, a thermal oxidation process is performed to the first epitaxial layer to form a semiconductor layer at a bottom of the recess and a silicon oxide layer formed on the semiconductor layer. Next, the silicon oxide layer is removed and followed by forming a second epitaxial layer on the semiconductor layer in the recess.

According to the semiconductor structure and the manufacturing method thereof provided by the present invention, at least a first epitaxial layer is formed before forming the second epitaxial layer, which serves as the main stress provider. More important, the first epitaxial undergoes a condensation by performing the thermal oxidation process. Consequently, the second semiconductor material in the first epitaxial layer is driven into the semiconductor substrate. Furthermore, since the second semiconductor material is driven into the arrangement of the first semiconductor material of the semiconductor substrate, the semiconductor layer including both of the first semiconductor material and the second semiconductor material is obtained. Because the second semiconductor material is driven into the arrangement of the first semiconductor material of the semiconductor substrate, no dislocation defect is formed. Therefore, the second epitaxial layer formed on the semiconductor layer and the followed formed fin include no dislocation defect. Briefly speaking, no dislocation defect occurs in the fin formed by the method provided by the present invention, and thus device performance is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a method for manufacturing a semiconductor structure provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
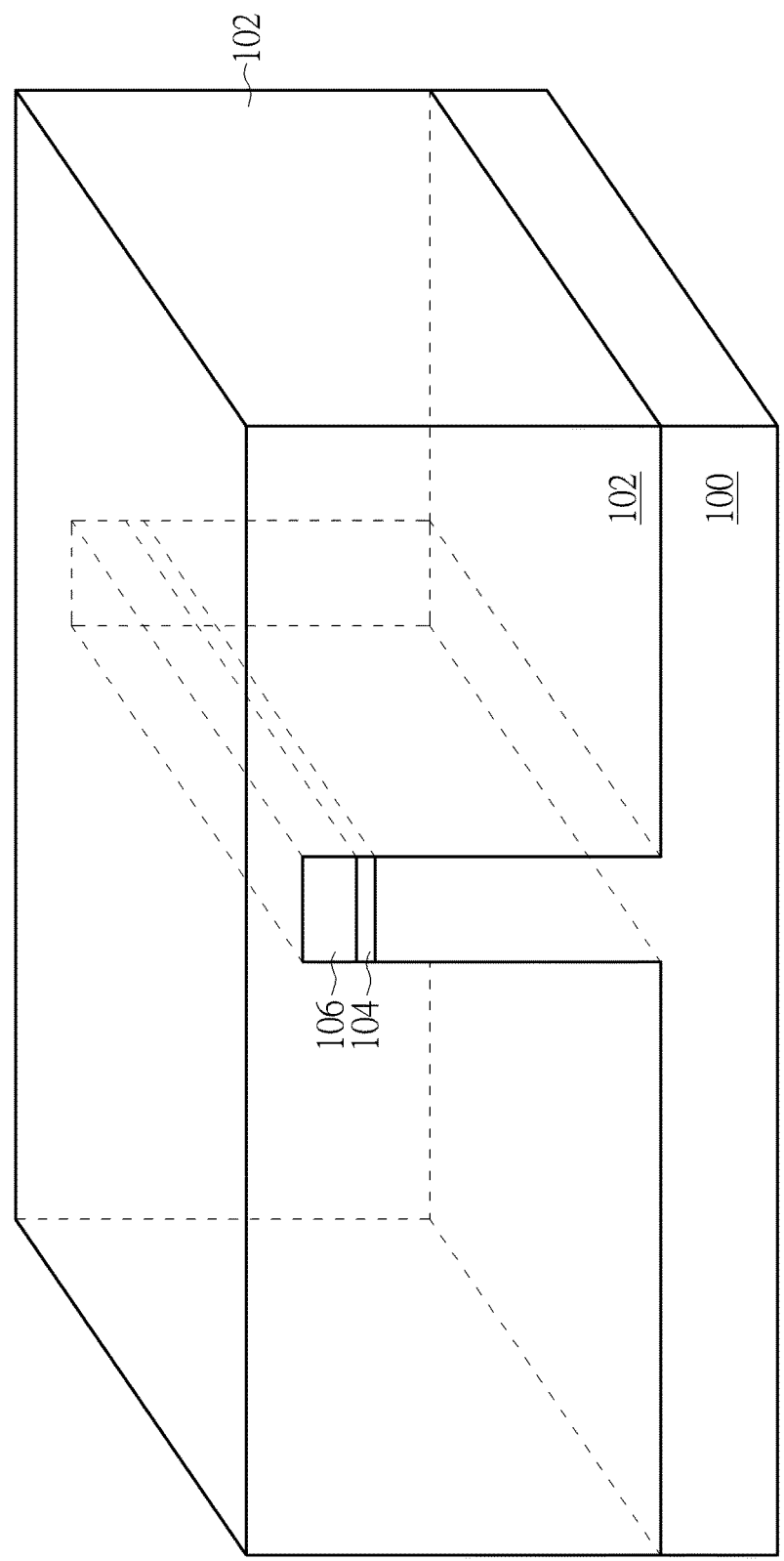

Please refer to FIGS. 1-8, which are schematic drawings illustrating a method for manufacturing a semiconductor structure provided by a preferred embodiment of the present invention. As shown in FIG. 1, a semiconductor substrate 100 is provided by the method. The semiconductor substrate 100 includes a first semiconductor material, and the first semiconductor material may be, for example but not limited to, silicon (Si), germanium (Ge), III-V compound, or II-VI compound. In some embodiments the first semiconductor material preferably includes Si, but not limited to this. Additionally, the semiconductor substrate 100 can be a bulk Si substrate. Next, a dielectric structure 102 is formed on the semiconductor substrate 100. The dielectric structure 102 can be formed by any suitable process such as shallow trench isolation (hereinafter abbreviated as STI) fabricating process. Generally speaking, a pad layer 104 and a hard mask layer 106 are sequentially formed on the semiconductor substrate 100 and followed by patterning. As shown in FIG. 1, the patterned hard mask layer 106 and pad layer 104 are used to define place and width of fin(s) to be formed, but not limited to this. Next, the semiconductor substrate 100 is etched with the patterned hard mask layer 106 and pad layer 104 serving as etching mask, and thus a plurality of trenches (not shown) are formed in the semiconductor substrate 100. Subsequently, an insulating material 102 is formed to fill up the trenches.

Figure 2:
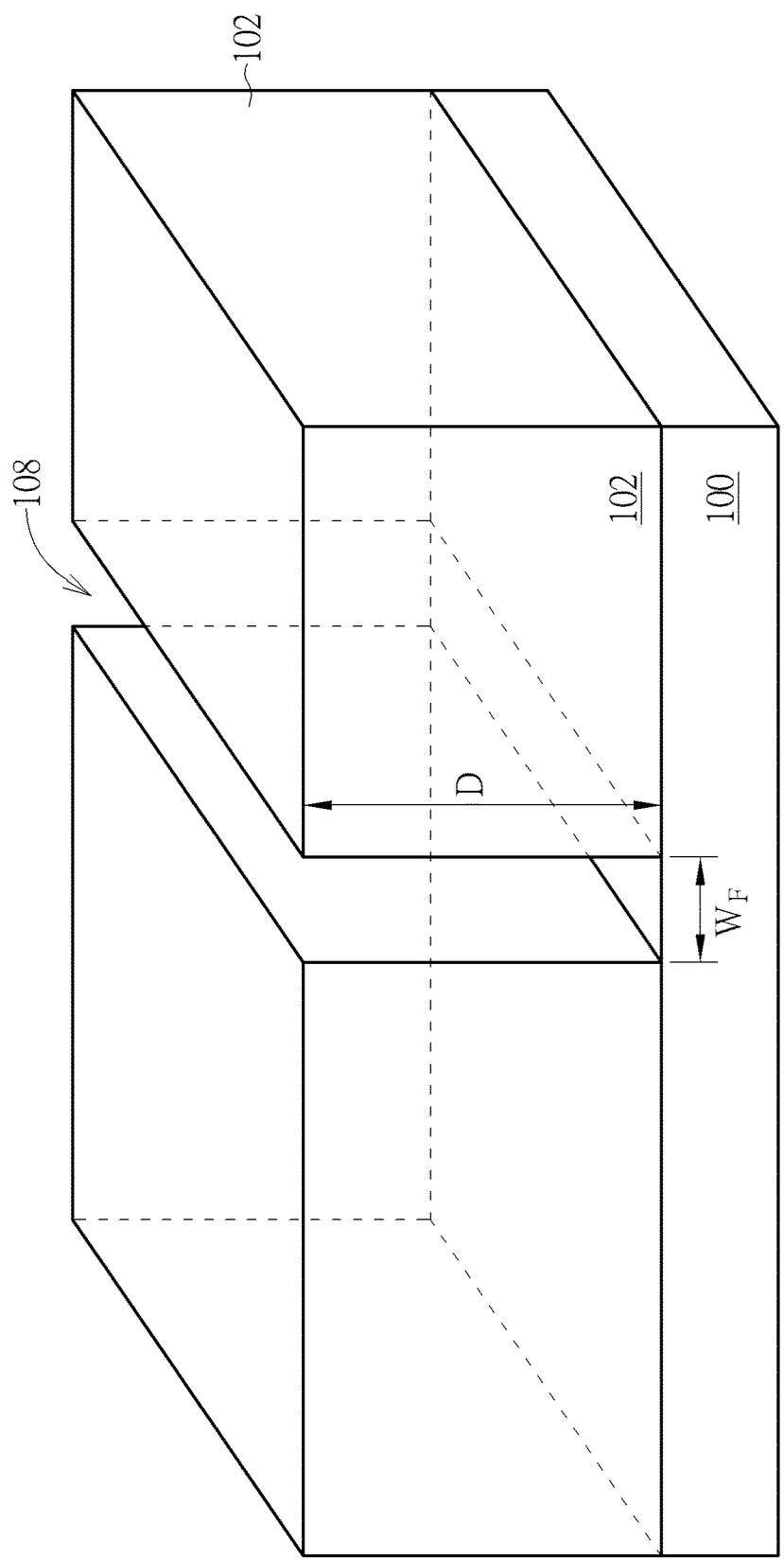

Please refer to FIG. 2. Next, a planarization process is performed to remove superfluous insulating material and the patterned hard mask layer 106/pad layer 104. Consequently, a plurality of STIs are formed on the semiconductor substrate 100, and those STIs are taken as the dielectric structure 102 in the preferred embodiment of the present invention. A proper etching process such as, for example but not limited to, a dry etching process is then performed to remove the semiconductor substrate 100 located in between the STIs 102, and thus at least a recess 108 is formed in the dielectric structure 102 (in between the STIs). According to the preferred embodiment, a bottom of the recess 108 is coplanar with a bottom of the dielectric structure 102 as shown in FIG. 2. Furthermore, the recess 108 includes a width $W_F$ and a depth D. The width $W_F$ of the recess 108 is equal to a width of the fin(s) to be formed. In some embodiments of the present invention, the width $W_F$ of the recess 108 can be between 10 nanometers (nm) and 15 nm, and the depth D of the recess 104 can be between 100 nm and 300 nm, but not limited to this.

Additionally, according to a modification to the present invention, the dry etching process used to remove the semiconductor substrate 100 in between the dielectric structure 102 can be performed to over-etch the semiconductor substrate 100 and an over-etched recess (not shown) is obtained. Accordingly, a bottom of the over-etched recess is lower than the bottom of the dielectric structure 102.

Figure 3:
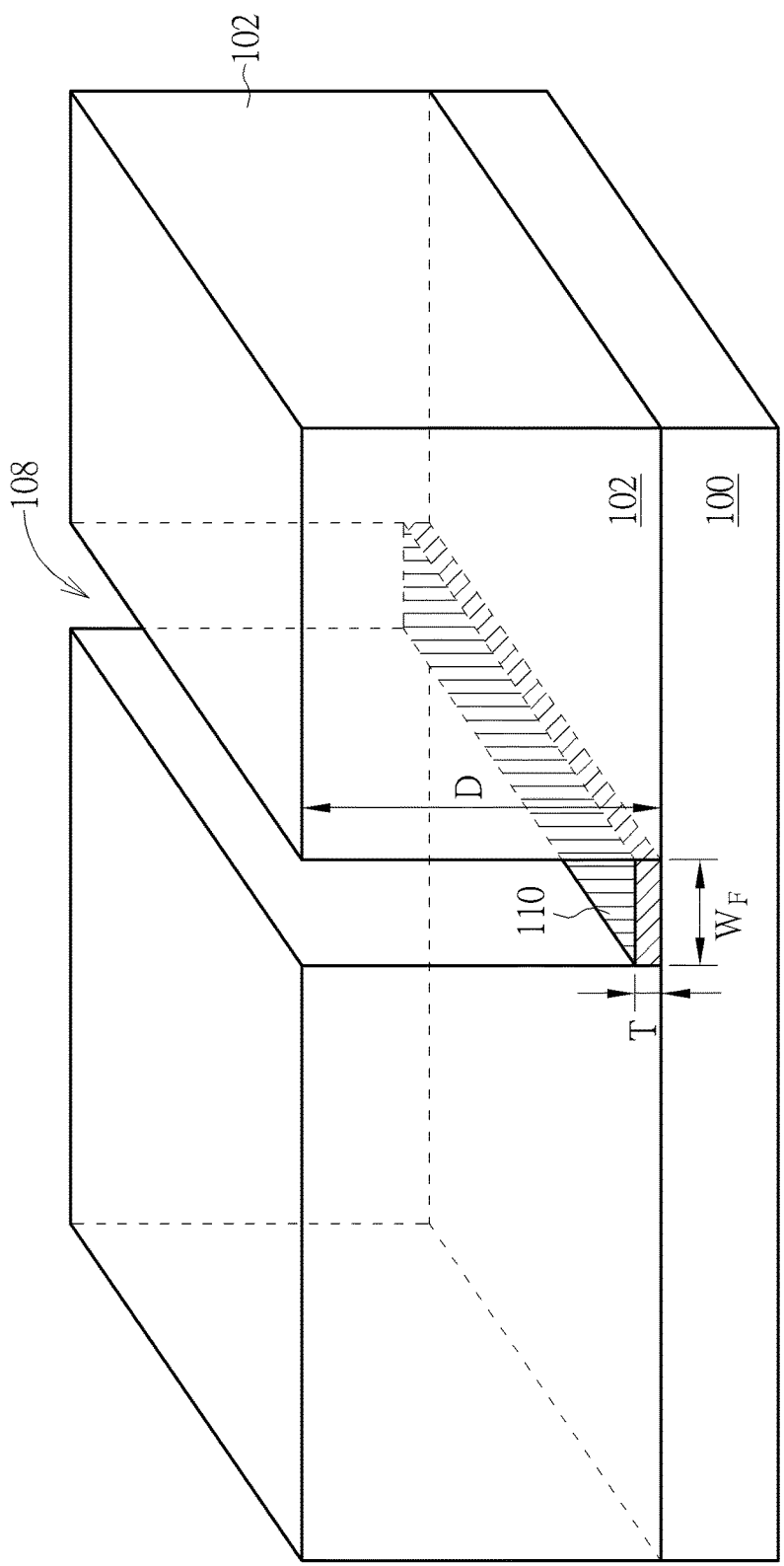

Please refer to FIG. 3. After forming the recess 108, a first epitaxial layer 110 is formed in the recess 108. In some embodiments of the present invention, the first epitaxial layer 110 can be formed by performing a SEG process, but not limited to this. The first epitaxial layer 110 includes at least a second semiconductor material, and a lattice constant of the second semiconductor material is different from a lattice constant of first semiconductor material. Preferably, the lattice constant of the second semiconductor material is larger than the lattice constant of first semiconductor material. In some embodiments of the present invention, the second semiconductor material can be Ge, therefore the first epitaxial layer 110 is an epitaxial Ge layer. Additionally, in some embodiments of the present invention, the first epitaxial layer 110 can include both the first semiconductor material and the second semiconductor material. In other words, the first epitaxial layer 110 can be an epitaxial SiGe layer. The first epitaxial layer 110 includes a thickness T, and the thickness T of the first epitaxial layer 110 is between 100 angstroms (Å) and 400 Å, but not limited to this.

Figure 4:
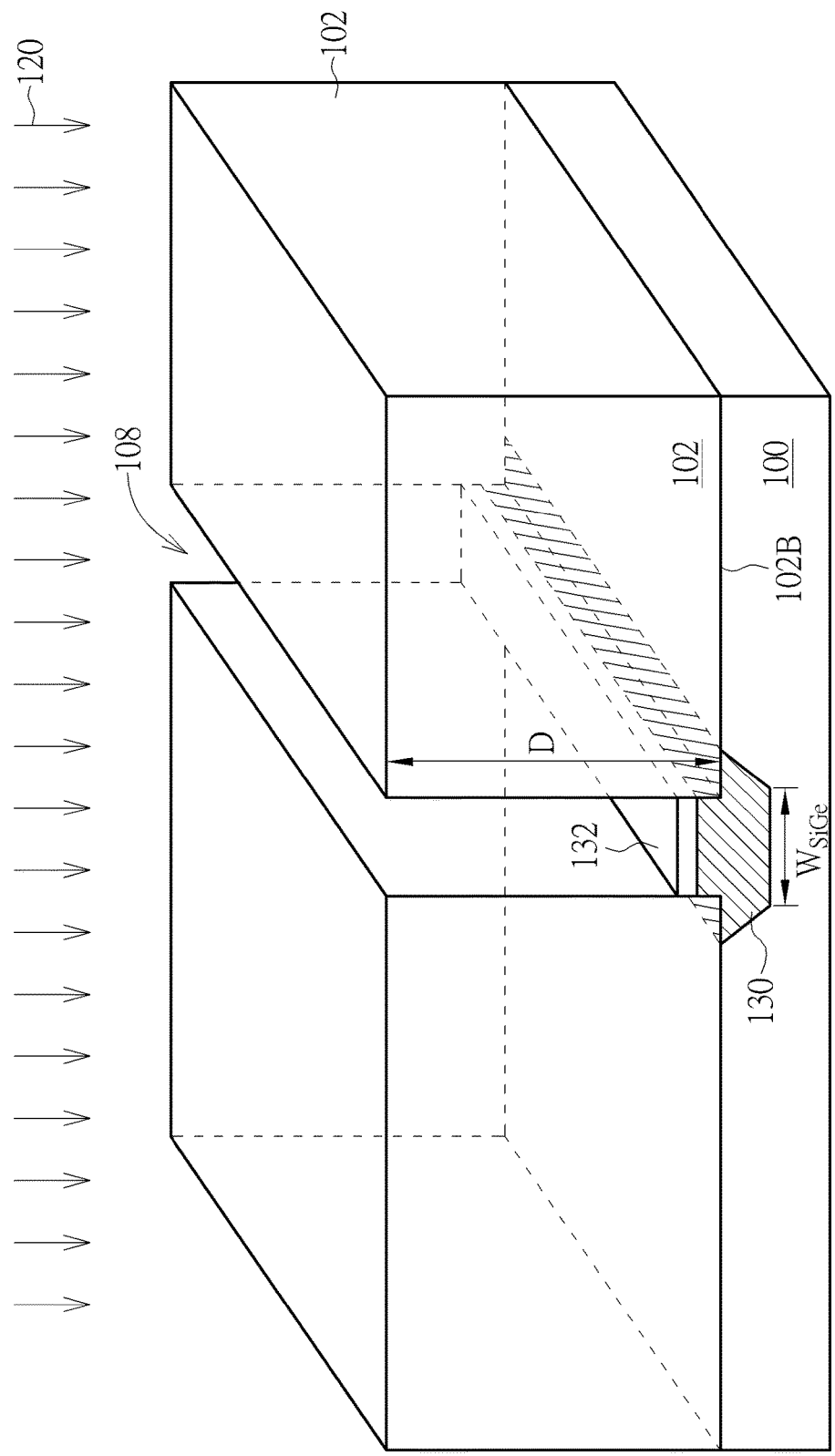

Please refer to FIG. 4. After forming the first epitaxial layer 110, a thermal oxidation process 120 is performed to the first epitaxial layer 110. The thermal oxidation process 120 includes a process temperature, and the process temperature is between 800° C. and 1000° C, but not limited to this. It is noteworthy that the thermal oxidation process 120 always includes oxygen. During the thermal oxidation process 120, the second semiconductor material in the first epitaxial layer 110, that is the Ge atoms, are driven or migrated inwardly into the semiconductor substrate 100. More important, the Ge atoms are driven into the Si arrangement of the semiconductor substrate 100. Consequently, a semiconductor layer 130 that is a SiGe layer is formed at a bottom of the recess 108. It is noteworthy that oxygen is used to catch the silicon atoms, and thus only Ge atoms are driven into the semiconductor substrate 100 in the thermal oxidation process 120 due to the presence of oxygen. Accordingly, a silicon oxide layer 132 is formed on the semiconductor layer 130. Briefly speaking, the first epitaxial layer 110 undergoes a condensation by performing the thermal oxidation process 120, and thus the first epitaxial layer 110 is automatically transferred to be the semiconductor layer 130 and the silicon oxide layer 132 formed on the semiconductor layer 130. Furthermore, the Ge atoms are driven/migrated laterally and vertically into the semiconductor substrate 100, and a widest width is obtained at an interface between the semiconductor layer 130 and the dielectric structure 102 as shown in FIG. 4, and the widest width is larger than a bottom width $W_{SiGe}$ of the semiconductor layer 130.

Please still refer to FIG. 4. It is noteworthy that since the lattice constant of Ge is larger than the lattice constant of Si, the bottom width $W_{SiGe}$ of the semiconductor layer 130 is larger the width $W_F$ of the recess 108. Furthermore, a bottom of the semiconductor layer 130 is lower than a surface of the semiconductor substrate 100 as shown in FIG. 4. And the bottom of the semiconductor layer 130 is also lower than a bottom surface 102B of the dielectric structure 102. More important, since Ge atoms are driven into the Si arrangement of the semiconductor substrate 100, no dislocation defect would occur in the semiconductor layer 130 regardless of the crystal plane of the semiconductor substrate 100.

Figure 5:
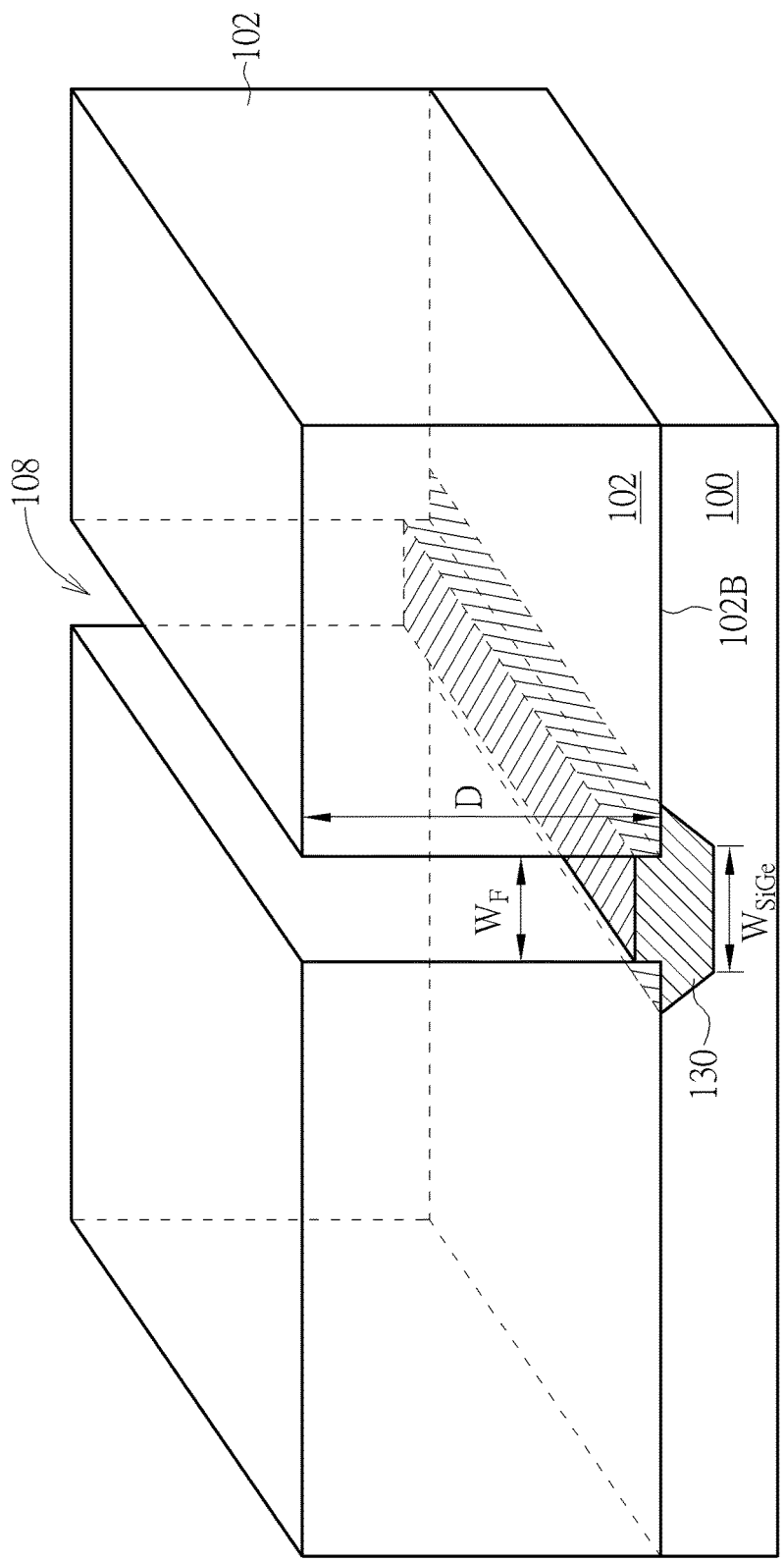

Please refer to FIG. 5. After forming the semiconductor layer 130 and the silicon oxide layer 132, an etching process is performed to remove the silicon oxide layer 132. Consequently, the semiconductor layer 130 is exposed in the recess 108 as shown in FIG. 5. Additionally, the dielectric structure 102 may be consumed in the etching process.

Figure 6:
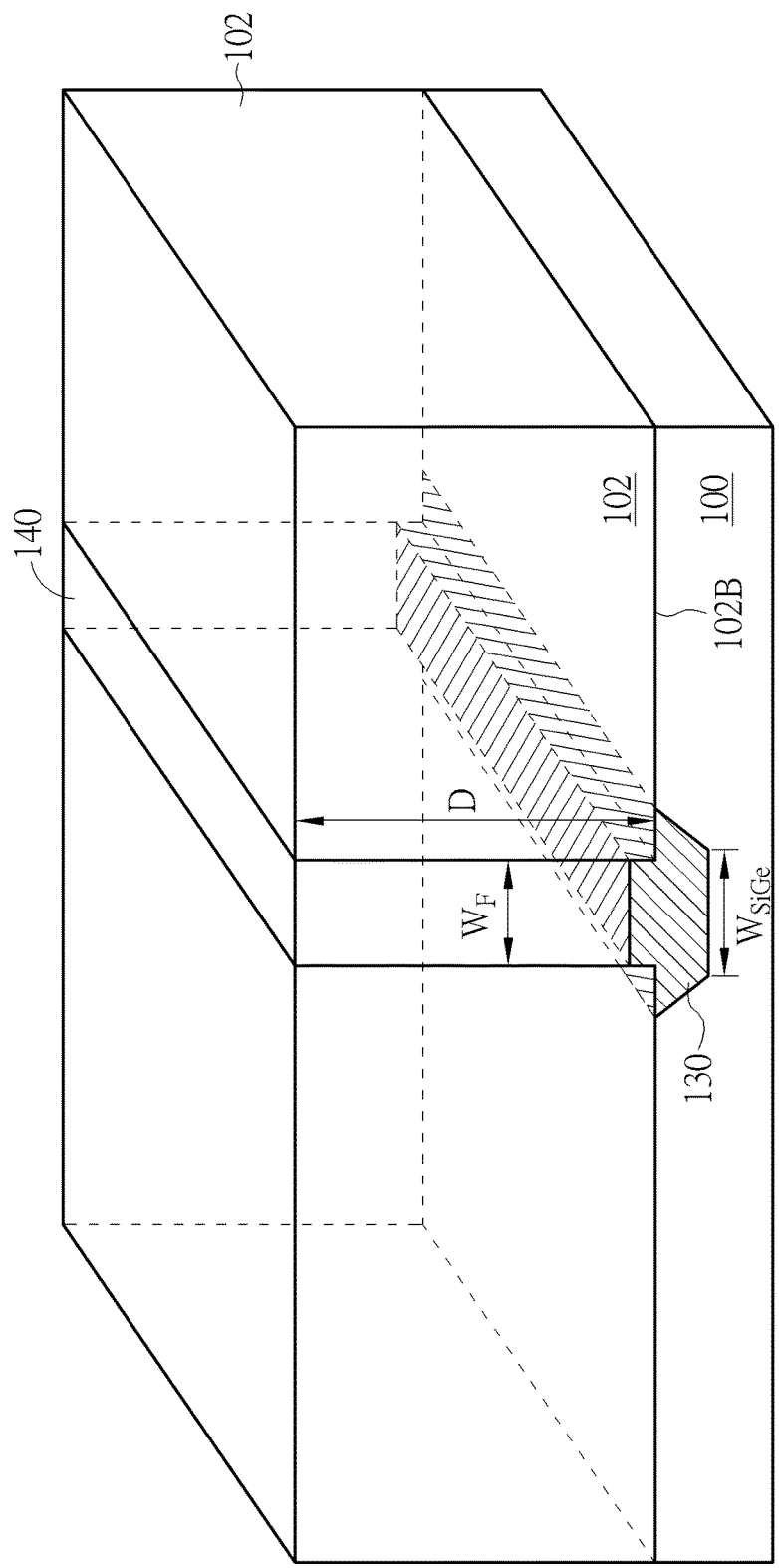

Please refer to FIG. 6. Next, a second epitaxial layer 140 is formed on the exposed the first epitaxial layer 130. In some embodiments of the present invention, the second epitaxial layer 140 can be formed by performing a SEG process, but not limited to this. As shown in FIG. 6, the recess 108 is filled up with the second epitaxial layer 140. Since the recess 108 is filled up with the second epitaxial layer 140, a width of the second epitaxial layer 140 is the width $W_F$ of the recess 108. It is therefore concluded that the width $W_{SiGe}$ of the semiconductor layer 130 is larger than the width $W_F$ of the second epitaxial layer 140. In some embodiments of the present invention, the second epitaxial layer 140 includes at least the first semiconductor material. In other words, the second epitaxial layer 140 can be an epitaxial Si layer. In some embodiments of the present invention, the second epitaxial layer 140 includes both the first semiconductor material and the second semiconductor material. In other words, the second epitaxial layer 140 can be an epitaxial SiGe layer. In those embodiments that the second epitaxial layer 140 includes SiGe, a concentration of the second semiconductor material (Ge concentration) in the second epitaxial layer 140 is between 20% and 80%, but not limited to this. Furthermore, in some embodiments of the present invention, the concentration of the second semiconductor material in the second epitaxial layer 140 can even be 100%.

It is noteworthy that in those embodiments that the second epitaxial layer 140 is an epitaxial Si layer, the semiconductor layer 130 renders a strained stress to the second epitaxial layer 140 because the semiconductor layer 130 includes SiGe. Thus carrier mobility of the second epitaxial layer 140 is improved. In those embodiments that the second epitaxial layer 140 is an epitaxial SiGe layer, the semiconductor layer 130 serves as an SiGe initial surface, which is better than the silicon initial surface, for growing the second epitaxial layer 140. It is well-known that the epitaxial layer is always grown along the initial surface of a semiconductor material, and the SiGe initial surface is better than the Si initial surface because SiGe initial surface is more homogeneous to SiGe epitaxial layer. Consequently, since the second epitaxial layer 140 is grown from the SiGe surface of the semiconductor layer 130 in those embodiments of the present invention, no dislocation defect occurs in the second epitaxial layer 140. Furthermore, because the semiconductor layer 130 renders a superior initial surface for growing the SiGe epitaxial layer, strain relaxed buffer (SRB), which is usually required in the prior art, can be eliminated in some embodiments of the present invention.

Figure 7:
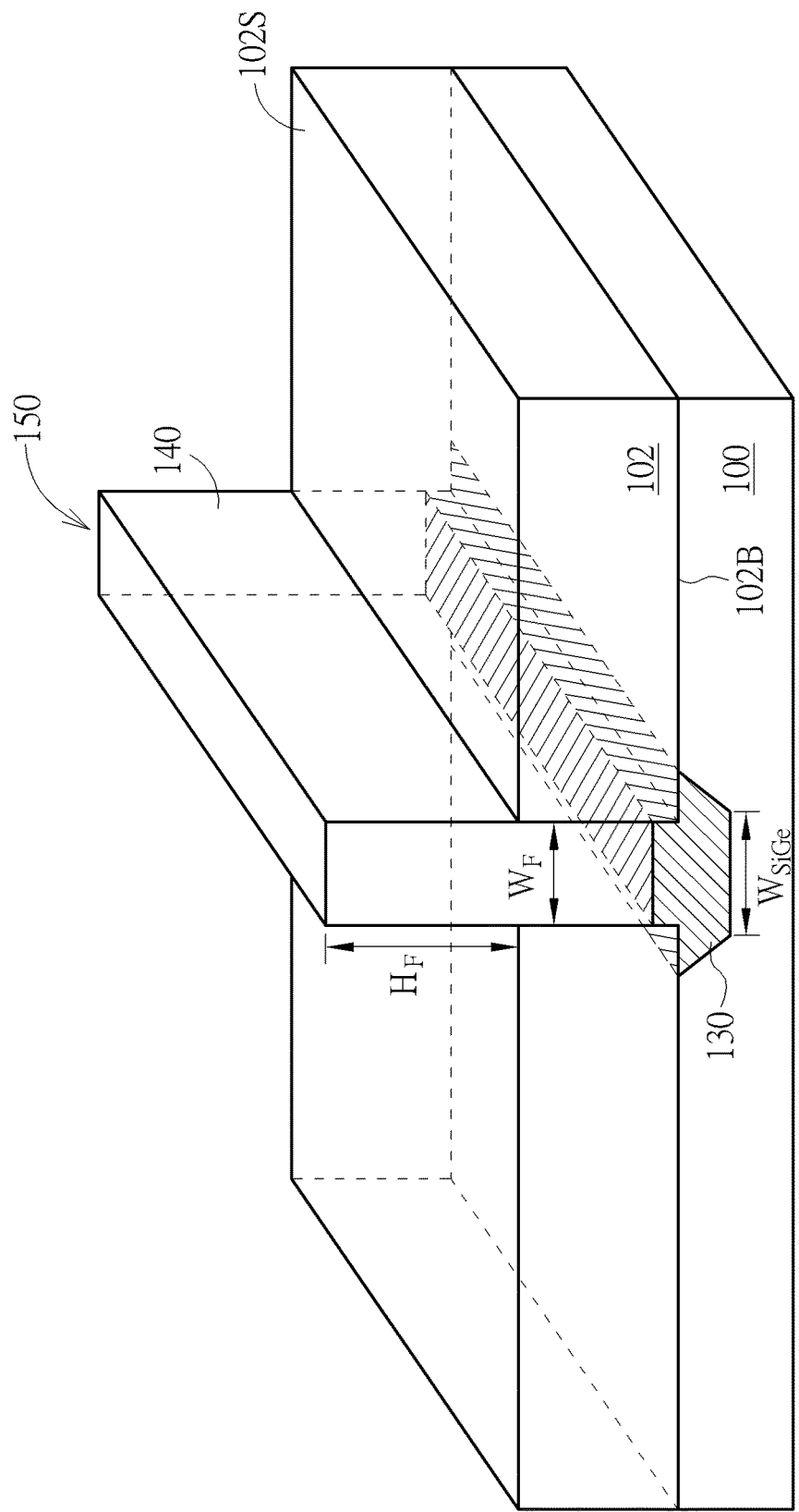

Please refer to FIG. 7. After forming the second epitaxial layer 140, an etching back process is performed to remove a portion of the dielectric structure 102. Consequently, a portion of the second epitaxial layer 140 is protruded from a top surface 102S of the dielectric structure 102. And thus a fin 150 is formed in the recess 108 in the dielectric structure 102 on the semiconductor substrate 100. As shown in FIG. 7, the fin 150 is protruded from the top surface 102S of the dielectric structure 102, and thus the fin 150 includes a height $H_F$ above the top surface 102S of the dielectric structure 102. Typically speaking, the height $H_F$ is also defined as the fin height. In some embodiments of the present invention, the fin height $H_F$ is between 20 nm and 50 nm, but not limited to this. Furthermore, a width $W_F$ of the fin 150 is the width $W_F$ of the recess 108. As shown in FIG. 7, the width $W_F$ of the fin 150 is smaller than the width $W_{SiGe}$ of the semiconductor layer 130.

Figure 8:
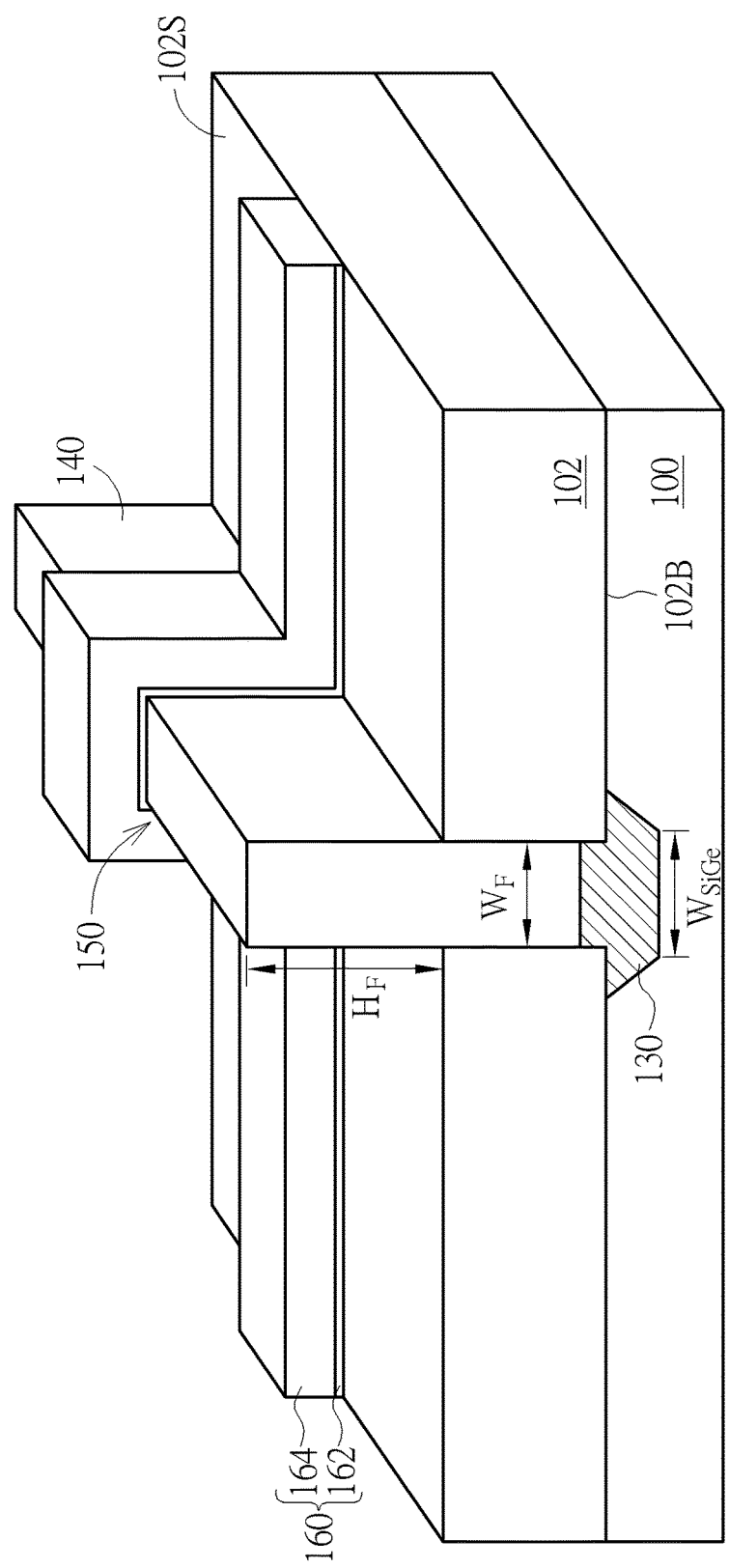

Please refer to FIG. 8. Next, a gate dielectric layer 162 and a gate conductive layer 164 are sequentially formed on the semiconductor substrate 100, particularly on the dielectric structure 102 and the fin 150. The gate dielectric layer 162 and the gate conductive layer 164 are then patterned to form a gate layer 160 on the fin 150. As shown in FIG. 8, an extending direction of the gate layer 160 is perpendicular to an extending direction of the fin 150. And the gate layer 160 covers a portion of the fin 150. In some embodiments of the present invention, the gate dielectric layer 162 can include the conventional dielectric material such as silicon oxide (SiO), silicon nitride (SiN), or silicon oxynitride (SiON). In some embodiments of the present invention, the gate dielectric layer 162 can further include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer 162 of the preferred embodiment adopts the high-K dielectric material, the present invention can be further integrated to the metal gate process. Therefore control gate compatible to the high-K gate dielectric layer is obtained. Accordingly, the gate conductive layer 164 can include different materials according to the gate-first or gate-last process. In some embodiments of the present invention integrated to the gate-first process, the gate conductive layer 164 includes metal such as tantalum (Ta), titanium (Ti), ruthenium (Ru), molybdenum (Mo), alloys of the aforementioned metals such as titanium al titanium aluminide (TiAl), metal nitride such as tantalum nitride (TaN), titanium nitride (TiN), molybdenum nitride (MoN), or metal carbide such as tantalum carbide (TaC). It is noteworthy that the metals are chosen by providing proper work function to the multi-gate transistors of different conductivity types. And the gate conductive layer 164 can be a single-layered or multi-layered structure. In some embodiments of the present invention integrated to the gate-last process, the gate conductive layer 164 serves as a dummy gate and includes semiconductor material such as polysilicon. After forming the gate layer 160, other steps for forming FinFET can be performed.

According to the semiconductor structure and the manufacturing method thereof provided by the present invention, at least a first epitaxial layer is formed before forming the second epitaxial layer, which serves as the main stress provider. More important, the first epitaxial undergoes a condensation by performing the thermal oxidation process. Consequently, the second semiconductor material in the first epitaxial layer is driven/migrated inwardly into the semiconductor substrate. Furthermore, the second semiconductor material is driven/migrated into the arrangement of the first semiconductor material of the semiconductor substrate, and thus the semiconductor layer including both of the first semiconductor material and the second semiconductor material is obtained. Since the second semiconductor material is driven into the arrangement of the first semiconductor material of the semiconductor substrate, no dislocation defect is formed. Therefore, the second epitaxial layer formed on the semiconductor layer and the followed formed fin include no dislocation defect. Briefly speaking, no dislocation defect occurs in the fin formed by the method provided by the present invention, and thus device performance is improved. Furthermore, the semiconductor layer itself can even serve as a stress provider to the fin, and thus carrier mobility in the channel region of the FinFET is further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor structure comprising:

providing a semiconductor substrate comprising a first semiconductor material, the semiconductor substrate comprising a dielectric structure formed thereon, and the dielectric structure comprising at least a recess formed therein;

forming a first epitaxial layer in the recess, the first epitaxial layer comprising at least a second semiconductor material, and a lattice constant of the second semiconductor material being larger than a lattice constant of the first semiconductor material;

performing a thermal oxidation process to the first epitaxial layer to form a semiconductor layer in the semiconductor substrate and a silicon oxide layer formed on the semiconductor layer, wherein the semiconductor layer has an inverted trapezoid shape with a slanted edge surface extended directly under the dielectric structure, and a width of the inverted trapezoid shape is wider than a width of the recess;

removing the silicon oxide layer; and forming a second epitaxial layer on the semiconductor layer in the recess.

2. The method for manufacturing the semiconductor structure according to claim 1, wherein the first epitaxial layer further comprises the first semiconductor material.

3. The method for manufacturing the semiconductor structure according to claim 1, wherein the first epitaxial layer comprises a thickness and the thickness is between 100 angstroms (Å) and 400Å.

4. The method for manufacturing the semiconductor structure according to claim 1, wherein the thermal oxidation process comprises a process temperature and the process temperature is between 800° C and 1000°C.

5. The method for manufacturing the semiconductor structure according to claim 1, wherein the second epitaxial layer comprises the first semiconductor material.

6. The method for manufacturing the semiconductor structure according to claim 5, wherein the second epitaxial layer further comprises the second semiconductor material.

7. The method for manufacturing the semiconductor structure according to claim 6, wherein a concentration of the second semiconductor material in the second epitaxial layer is between 20% and 80%.

8. The method for manufacturing the semiconductor structure according to claim 1, further comprising removing a portion of the dielectric structure to form a fin in the recess.

9. The method for manufacturing the semiconductor structure according to claim 8, wherein a top surface of the fin is higher than a top surface of the dielectric structure.

10. The method for manufacturing the semiconductor structure according to claim 8, further comprising forming a gate layer on the fin.

11. The method for manufacturing the semiconductor structure according to claim 1, wherein a bottom of the recess exposes a top surface of the substrate.

12. The method for manufacturing the semiconductor structure according to claim 11, wherein the first epitaxial layer is directly formed on the top surface of the substrate and only filling a lower portion of the recess.

13. The method for manufacturing the semiconductor structure according to claim 11, wherein the semiconductor layer is lower than the top surface of the substrate.

14. The method for manufacturing the semiconductor structure according to claim 1, wherein the second epitaxial layer is directly formed on the semiconductor layer and completely fills up the recess.

* * * * *